US011929715B2

(12) United States Patent
Tirumala et al.

(10) Patent No.: US 11,929,715 B2
(45) Date of Patent: Mar. 12, 2024

(54) METHOD AND APPARATUS FOR MODULATING AMPLIFIER SUPPLY VOLTAGE FOR REDUCING POWER DISSIPATION

(71) Applicant: Microchip Technology Incorporated, Chandler, AZ (US)

(72) Inventors: Rohit Tirumala, Sunnyvale, CA (US); Miguel Salcedo, Watsonville, CA (US); Donald Humbert, Santa Clara, CA (US)

(73) Assignee: MICROCHIP TECHNOLOGY INCORPORATED

( * ) Notice: Subject to any disclaimer, the term of this patent is extended or adjusted under 35 U.S.C. 154(b) by 379 days.

(21) Appl. No.: 17/336,504

(22) Filed: Jun. 2, 2021

(65) Prior Publication Data

US 2022/0045648 A1 Feb. 10, 2022

Related U.S. Application Data

(60) Provisional application No. 63/062,675, filed on Aug. 7, 2020.

(51) Int. Cl.
*H03F 3/04* (2006.01)
*G01R 19/04* (2006.01)
(Continued)

(52) U.S. Cl.
CPC .......... *H03F 1/0227* (2013.01); *G01R 19/04* (2013.01); *H03K 5/1532* (2013.01)

(58) Field of Classification Search
CPC .. H03F 1/0227; H03F 2200/321; H03F 3/211; H03F 3/45475; H03F 3/68;
(Continued)

(56) References Cited

U.S. PATENT DOCUMENTS 7,834,702 B2 * 11/2010 Jones ........................ H03F 3/68
330/136
9,319,495 B2 * 4/2016 D'Souza ............... H03F 1/0227
(Continued)

FOREIGN PATENT DOCUMENTS

EP 2056451 A2 5/2009

OTHER PUBLICATIONS

Search Report and Written Opinion of the International Searching Authority, European Patent Office, dated Nov. 3, 2021, International Application No. PCT/US2021/043663.

*Primary Examiner* — Khanh V Nguyen
(74) *Attorney, Agent, or Firm* — Burr & Forman LLP; Ryan M. Corbett

(57) ABSTRACT

A circuit to modulate the power supply to track input or output voltages provided to or output by a plurality of amplifiers to reduce power dissipation is provided. The circuit may include a peak detection circuit configured to receive a plurality of voltages respectively corresponding to the plurality of amplifiers, and to detect and output information regarding a maximum instantaneous voltage from the received plurality of voltages, and a summing circuit configured to output a sum of the information regarding the maximum instantaneous voltage and an amplifier headroom voltage. A reference voltage may be provided for the supply voltage responsive to the output sum. The circuit may also include a scaling circuit configured to scale the output sum, and the reference voltage may be a scaled reference voltage output by the scaling circuit.

21 Claims, 11 Drawing Sheets

(51) Int. Cl.
*H03F 1/02* (2006.01)
*H03K 5/1532* (2006.01)

(58) Field of Classification Search
CPC ........ H03F 1/0238; H03F 3/04; H03F 1/0244; H03F 1/0211; H03F 2200/504; H03F 1/0222; H03F 2200/102; G01R 19/04; H03K 5/1532; H03G 3/3042; H03G 3/3036; H03G 3/001; H03G 3/004; H03G 3/20
USPC .................................. 330/127, 136, 279, 297
See application file for complete search history.

(56) References Cited

U.S. PATENT DOCUMENTS

| | | | |
|---|---|---|---|
| 10,128,803 B2 * | 11/2018 | Das | ................. H03F 3/183 |
| 2017/0310280 A1 | 10/2017 | LaBundy et al. | |
| 2019/0052229 A1 | 2/2019 | Su | |

* cited by examiner

METHOD AND APPARATUS FOR MODULATING AMPLIFIER SUPPLY VOLTAGE FOR REDUCING POWER DISSIPATION

CROSS-REFERENCE TO RELATED APPLICATION

This application claims the benefit of U.S. Provisional Patent Application No. 63/062,675, filed on Aug. 7, 2020, which is incorporated herein by reference in its entirety.

TECHNICAL FIELD

The present disclosure generally relates to amplifiers, and more particularly to a method and apparatus for regulating the supply voltage applied to amplifiers to reduce power dissipation.

BACKGROUND

In certain applications, such as haptic applications, amplifiers are used to create complex patterns. A single power supply is often used to provide power for multiple amplifiers. For example, FIG. 1 shows a circuit diagram of a haptic application according to the prior art. Referring to FIG. 1, an amplifier array 105 containing four amplifiers is configured to respectively drive four haptic elements 110. The amplifier array 105 is supplied power by one power supply 115. FIG. 2 illustrates a waveform showing the power supply voltage 200 supplied to the amplifier array 105 by power supply 115, and the output voltage 205 of one of the amplifiers of the amplifier array 105. As is known to those skilled in the art, the power supply voltage 200 generated by power supply 115 is controlled responsive to a provided reference voltage 210 that is generated by a microcontroller 120, which reference voltage 210 is generally fixed by design. Referring to FIGS. 1 and 2, an input voltage is provided to a low-dropout (LDO) regulator 125 that regulates the input voltage and provides a regulated voltage to power the microcontroller 120. The microcontroller 120 outputs four digital control signals CNT1 to CNT4 that are respectively input to an array of four digital-to-analog converters (DACs) 130. The array of DACs 130 converts the received digital control signals CNT1 to CNT4 to analog input voltages that are respectively provided to the amplifiers of amplifier array 105. One of the analog input voltages is shown in FIG. 2 as reference numeral 215, and is amplified by one of the amplifiers of the amplifier array 105 to generate output voltage 205. The shaded part of FIG. 2, indicated by reference numeral 220, indicates the excess headroom between the power supply voltage 200 and the output voltage 205, which corresponds to excess power dissipation.

Moreover, since the four amplifiers are independent of each other, the signals they are generating could vary significantly. For example, FIG. 3 shows example output voltage waveforms of two of the amplifiers of amplifier array 105 shown in FIG. 1. Output voltage waveform 300 illustrates the output voltage of a first amplifier, and output voltage waveform 305 illustrates the output voltage of a second amplifier. As shown in FIG. 3, the peak amplitude of output voltage 300 is greater than the amplitude of the output voltage 305. Therefore, the voltage supply rail that would otherwise be sufficient for output voltage 305 is not sufficient for higher amplitude output voltage 300. Thus, the common voltage rail providing the power supply voltage 200 of power supply 115, or a derivative thereof, is set to the highest peak output voltage, plus a certain amount of headroom, to ensure that the amplifiers do not saturate. Because some of the amplifiers output a much lower voltage than the highest peak output voltage, the high common voltage rail leads to excessive power dissipation in the amplifiers that do not need such large supply voltages. For battery-based applications, this excessive power dissipation may reduce the amount of run time that can be achieved before the battery needs to be recharged.

Although it is possible to provide a separate voltage supply for each amplifier that corresponds to the peak output voltage of the amplifier, providing separate voltage supplies increases the number of components and complexity of the design, and requires additional circuit board space. Therefore, there is a need to provide a supply voltage to multiple amplifiers generating various output voltages, which each may vary over time, in a way that reduces power dissipation without increasing the complexity of the design or requiring excessive circuit board space.

SUMMARY

According to an aspect of various examples of the present disclosure, there is provided a circuit for modulating a power supply voltage provided to a plurality of amplifiers to track an input voltage provided to the plurality of amplifiers to reduce power dissipation. The circuit may include a peak detection circuit configured to receive respective analog input voltages provided to the plurality of amplifiers, and to detect and output information regarding a maximum instantaneous analog input voltage from the received respective analog input voltages, and a summing circuit configured to output a sum of the information regarding the maximum instantaneous analog input voltage output from the peak detection circuit and an amplifier headroom voltage. A reference voltage may be provided for the power supply voltage responsive to the output sum.

The circuit may also include a scaling circuit configured to scale the output sum. The reference voltage provided for the power supply voltage may be responsive to an output of the scaling circuit. The amplifier headroom voltage may be a predetermined voltage configured to avoid saturating the plurality of amplifiers.

According to another aspect of various examples of the present disclosure, there is provided a circuit for modulating a power supply voltage provided to a plurality of amplifiers. The circuit may include a peak detection circuit configured to receive a plurality of respective digital control signals provided for the plurality of amplifiers, and to detect and output information regarding a maximum digital control signal from the plurality of respective digital control signals, and a summing circuit configured to output a sum of the information regarding the maximum digital control signal output from the peak detection circuit and an amplifier headroom voltage. A reference voltage may be provided for the power supply voltage responsive to the output sum.

The circuit may also include a scaling circuit configured to scale the output sum, and the reference voltage may be responsive to an output of the scaling circuit. The amplifier headroom voltage may be a predetermined voltage configured to avoid saturating the plurality of amplifiers.

According to an aspect of various examples of the present disclosure, there is provided a circuit for modulating a power supply voltage provided to a plurality of amplifiers. The circuit may include a peak detection circuit configured to receive a plurality of respective output voltages output by the plurality of amplifiers, and to detect and output information regarding a maximum instantaneous output voltage from the received respective output voltages, and a summing circuit configured to output a sum of the information regarding the maximum instantaneous output voltage output from the peak detection circuit and an amplifier headroom voltage. A reference voltage may be provided for the power supply voltage responsive to the output sum.

The circuit may also include a scaling circuit configured to scale the output sum, and the reference voltage may be responsive to an output of the scaling circuit. The amplifier headroom voltage may be a predetermined voltage configured to avoid saturating the plurality of amplifiers.

According to an aspect of various examples of the present disclosure, there is provided a circuit for modulating a power supply voltage provided to a plurality of amplifiers. The circuit may include a peak detection circuit configured to receive a plurality of voltages respectively corresponding to the plurality of amplifiers, and to detect and output information regarding a maximum instantaneous voltage from the received plurality of voltages, and a summing circuit configured to output a sum of the information regarding the maximum instantaneous voltage output from the peak detection circuit and an amplifier headroom voltage. A reference voltage may be provided for the supply voltage responsive to the output sum.

The circuit may also include a scaling circuit configured to scale the output sum, and the reference voltage may be responsive to an output of the scaling circuit. The amplifier headroom voltage may be a predetermined voltage configured to avoid saturating the plurality of amplifiers.

According to an aspect of various examples of the present disclosure, there is provided a method of modulating a power supply voltage provided to a plurality of amplifiers. The method may include receiving a plurality of voltages respectively corresponding to the plurality of amplifiers, detecting a maximum instantaneous voltage from the received plurality of voltages and outputting information regarding the maximum instantaneous voltage, generating a reference voltage by summing the information regarding the maximum instantaneous voltage and an amplifier headroom voltage, and providing the reference voltage to a power supply, the power supply providing the power supply voltage to the plurality of amplifiers responsive to the provided reference voltage.

The method may further include scaling the reference voltage to generate a scaled reference voltage, and providing the scaled reference voltage to the power supply as the reference voltage. The amplifier headroom voltage may be a predetermined voltage configured to avoid saturating the plurality of amplifiers.

BRIEF DESCRIPTION OF DRAWINGS

A more complete understanding of the examples disclosed herein, and the attendant advantages and features thereof, will be more readily understood by reference to the following detailed description when considered in conjunction with the accompanying drawings wherein.

DETAILED DESCRIPTION OF VARIOUS EXAMPLES

Figure 1:
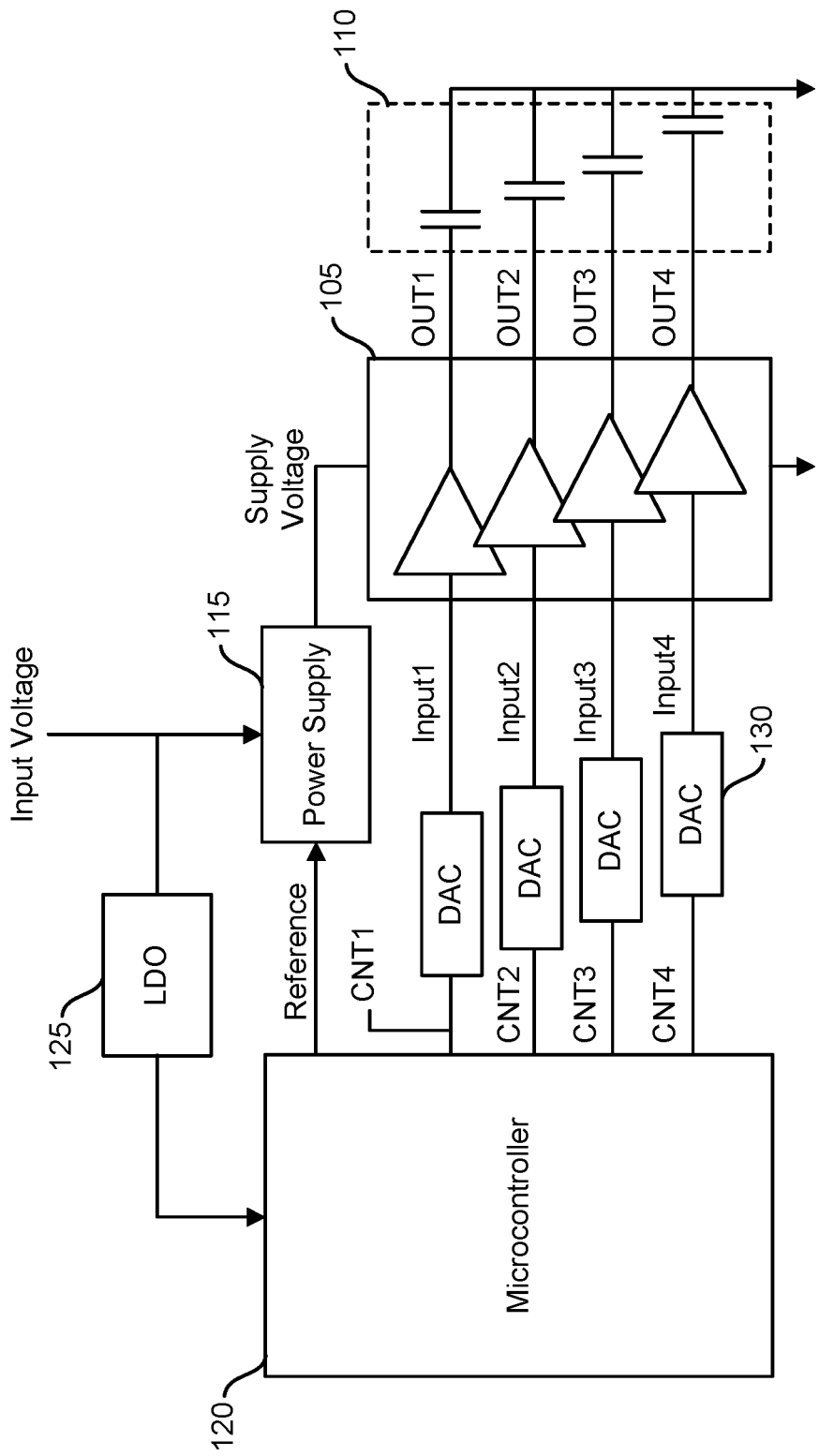
FIG. 1 shows a circuit diagram of a haptic application according to the prior art.

Reference will now be made in detail to the following examples, which are illustrated in the accompanying drawings, wherein like reference numerals refer to like elements throughout. The various examples may be embodied in various forms without being limited to the various examples set forth herein. Descriptions of well-known parts are omitted for clarity.

Figure 4A:
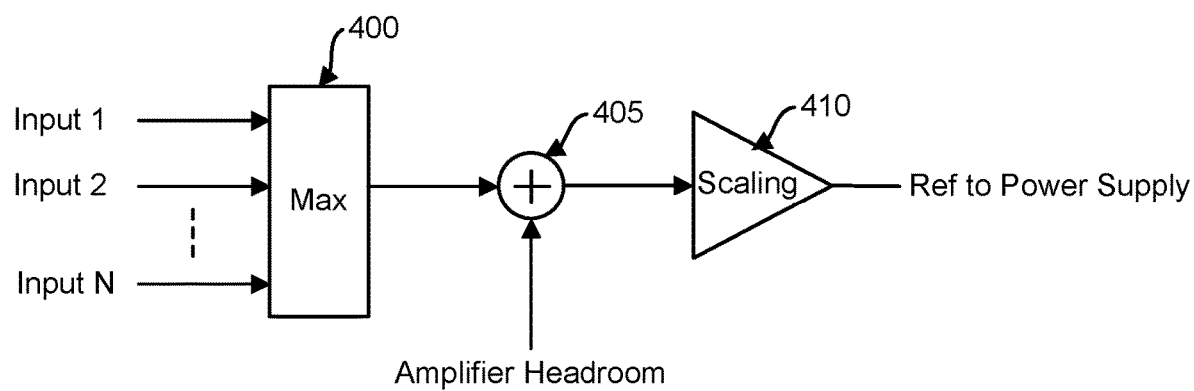
FIG. 4A shows a circuit for generating a reference voltage provided to a power supply that modulates a power supply voltage to track the analog input voltage provided to multiple amplifiers according to various examples of the present disclosure.
Figure 4B:
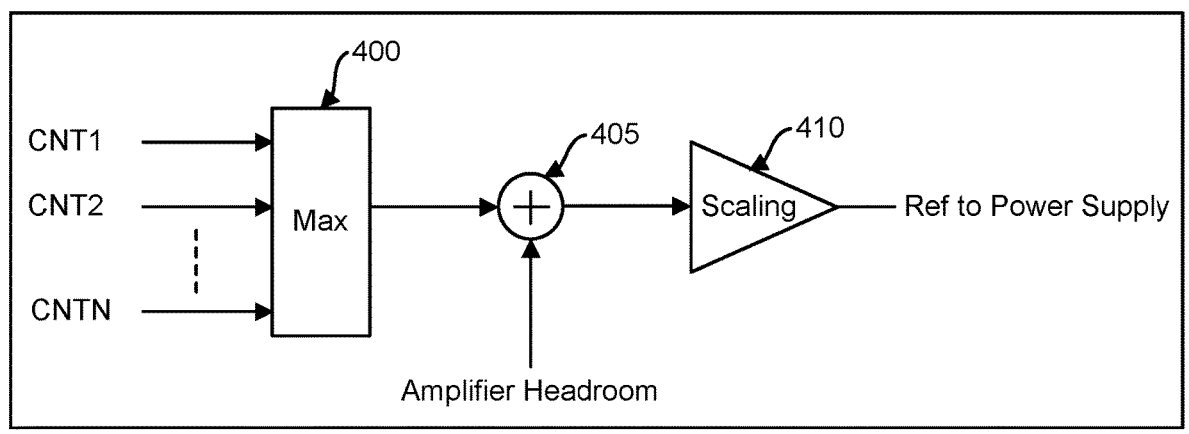
FIG. 4B shows a circuit for generating a reference voltage provided to a power supply that modulates a power supply voltage to track the digital control signals that are converted and ultimately provided as input voltages to multiple amplifiers according to various examples of the present disclosure.

FIG. 4A shows a circuit for generating a reference voltage provided to a power supply that modulates a power supply voltage to track the analog input voltage of multiple amplifiers according to various examples of the present disclosure. Referring to FIG. 4A, the circuit may include a peak detection circuit 400 that is configured to receive analog input voltages provided to multiple amplifiers. The peak detection circuit 400 is configured to detect the instantaneous analog input voltage for each of the received amplifier input voltages, and identify and output information regarding the maximum instantaneous analog input voltage of the received amplifier analog input voltages. In various examples, the information is the maximum instantaneous analog input voltage. For example, FIG. 4D shows an analog example of the peak detection circuit 400 that includes two comparators 415 and 420 configured to respectively receive input voltages VIN1 and VIN2, and is configured to output the instantaneous maximum voltage of the received input voltages VIN1 and VIN2. One skilled in the art would understand that the example peak detection circuit of FIG. 4D could be scaled to accommodate additional input voltages.

The maximum instantaneous input voltage is input to a summing circuit 405 that outputs the sum of the received information regarding the maximum instantaneous input voltage and an amplifier headroom voltage. The amplifier headroom voltage may vary depending on the application but may be determined to avoid saturating any of the amplifiers, e.g. of amplifier array 105. The output of the summing circuit 405 may be input into a scaling circuit 410 that is configured to scale the sum of the received information regarding the maximum instantaneous input voltage and the amplifier headroom voltage output from the summing circuit 405 to be greater, or lesser, depending on the application, to generate a reference voltage to be provided for the power supply responsive to the scaled sum. The generated reference voltage of the scaling circuit 410 may be provided as a reference to the power supply, such as power supply 115, which provides a power supply voltage to the plurality of amplifiers such as the amplifier array 105, which power supply voltage is modulated responsive to the provided reference voltage. Alternatively, the scaling circuit 410 may not be necessary depending on the application, in which case the reference voltage provide to the power supply may be responsive to the output of the summing circuit 405, e.g. the output of the summing circuit 405 may be provided as a reference voltage to the power supply, such as power supply 115, which provides the power supply voltage to the plurality of amplifiers.

In various examples, a digital representation of the maximum input voltage is provided and increased by a digital representation of the amplifier headroom voltage, and then optionally scaled. For example, FIG. 4B shows a circuit for modulating a power supply voltage to track the digital control signals output by the microcontroller 120, e.g., CNT1 to CNT4, in which peak detection circuit 400 may receive the digital control signals, identify a maximum, and output information regarding the maximum digital control signal of the received digital control signals output by the microcontroller 120. In various examples, the information is the control signal indicative of the maximum value for the input voltage to be provided by the respective DAC. The maximum digital control signal may be increased by a digital representation of the amplifier headroom voltage using summing circuit 405, and then optionally scaled by scaling circuit 410. The digital, optionally-scaled voltage may then be provided as the reference voltage to the power supply 115, or the reference voltage to the power supply 115 may be responsive to the digital, optionally-scaled voltage. In one example, the digital, optionally-scaled voltage, may be converted by a D/A converter for provision as the reference voltage to the power supply 115.

Figure 4C:
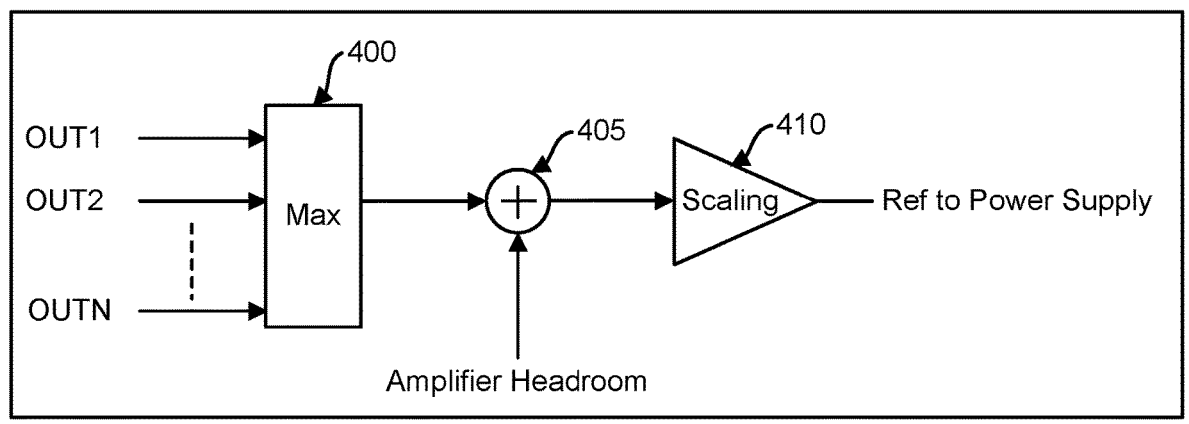
FIG. 4C shows a circuit for generating a reference voltage provided to a power supply that modulates a power supply voltage to track the analog output voltages output by multiple amplifiers according to various examples of the present disclosure.
Figure 4D:
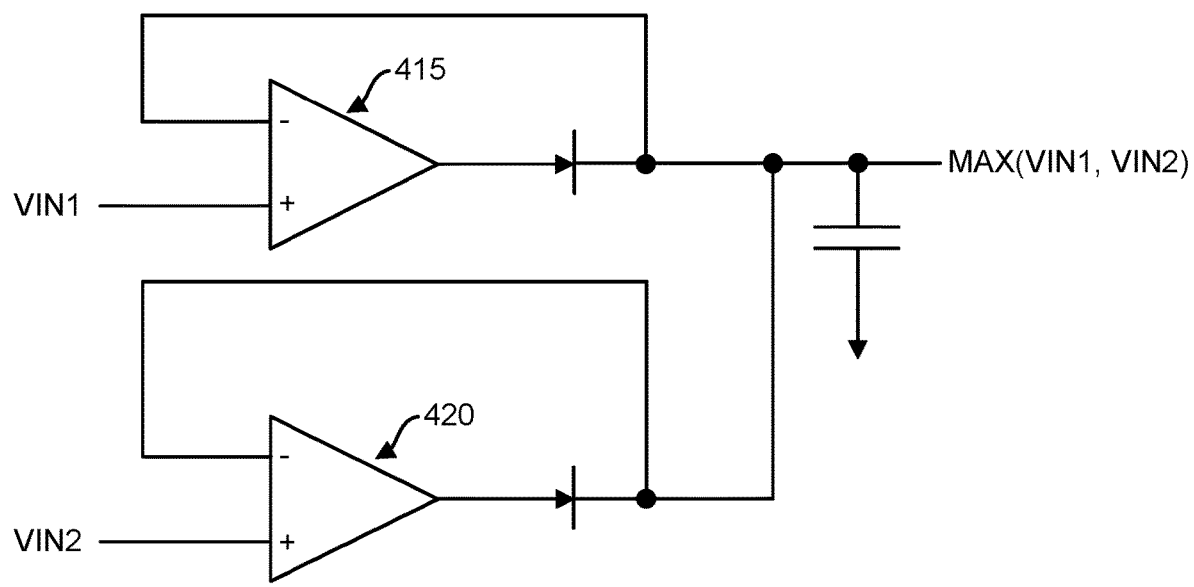
FIG. 4D shows an analog example of the peak detection circuit 400 of FIG. 4A.

According to various examples, with reference to FIG. 4C, the peak detection circuit 400 may be configured to receive a representation of output voltages OUT1 to OUT4 from the plurality of amplifiers 105, and identify and output information regarding the maximum instantaneous output voltage of the received amplifier output voltages. According to various examples of the present disclosure, the information is the maximum instantaneous output voltage. The maximum instantaneous output voltage is input to the summing circuit 405, which outputs the sum of received information regarding the maximum instantaneous output voltage and the amplifier headroom voltage. The output of the summing circuit 405 may be input into a scaling circuit 410 that is configured to scale the voltage output from the summing circuit 405 to be greater or lesser depending on the application. The output voltage of the scaling circuit 410 is provided as a reference voltage to the power supply, such as power supply 115, which provides a power supply voltage to the plurality of amplifiers such as the amplifier array 105, which power supply voltage is modulated responsive to the provided reference voltage. Alternatively, the scaling circuit 410 may not be necessary depending on the application, in which case the output of the summing circuit 405 may be provided as a reference voltage to the power supply, such as power supply 115, which provides the power supply voltage to the plurality of amplifiers. There is no requirement that the output of the output of the summing circuit 405, or of the scaling circuit 410, be used directly as the reference voltage, and the reference voltage may be generated responsive to the output of the summing circuit 405, or of the scaling circuit 410, without exceeding the scope.

Figure 2:
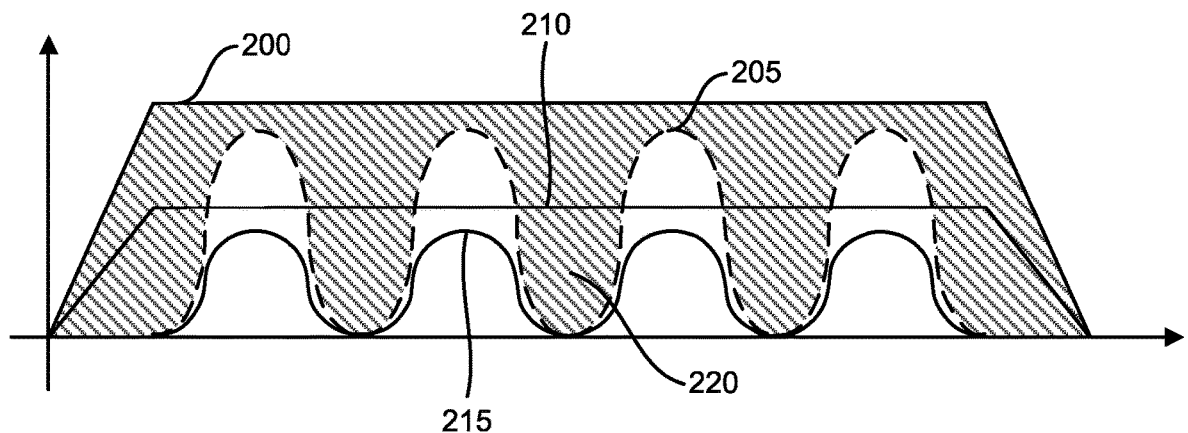
FIG. 2 shows voltage waveforms comparing an amplifier output voltage with a supply voltage according to the prior art.
Figure 3:
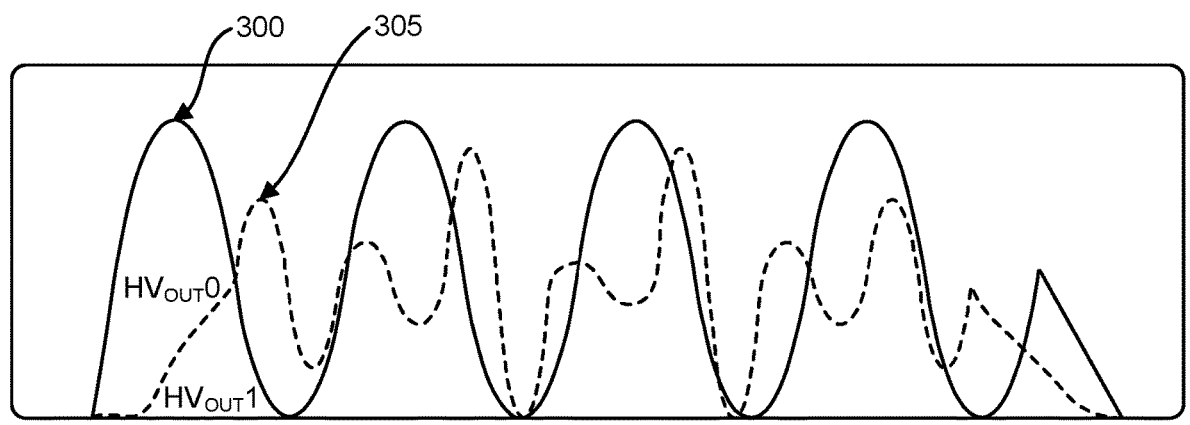
FIG. 3 shows voltage waveforms comparing output voltages of two amplifiers according to the prior art.
Figure 5:
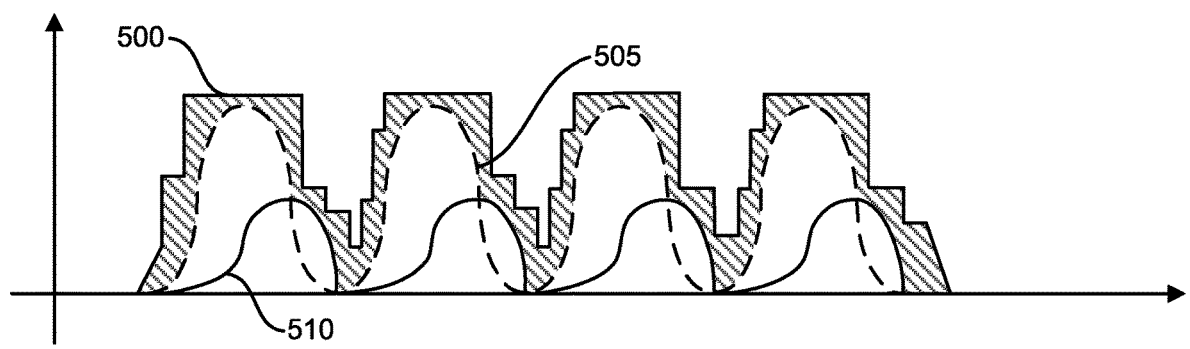
FIG. 5 shows voltage waveforms comparing output voltages of two amplifiers with a modulated supply voltage according to various examples of the present disclosure.

FIG. 5 shows a waveform diagram showing a power supply voltage 500 that has been modulated based on a maximum instantaneous analog input voltage, and respective output voltages 505 and 510 of two of the plurality of amplifiers, according to various examples. In contrast to FIG. 2, the modulated power supply voltage 500 tracks the output voltage 505, with the addition of a certain amplifier headroom voltage, and reduces the power dissipation as compared to the power supply voltage 200 of FIG. 2 by 50-60%. By reducing power dissipation, the modulated power supply voltage 500 may also result in reduced heat emission, and increased battery cycle time for applications that use a battery.

Figure 6A:
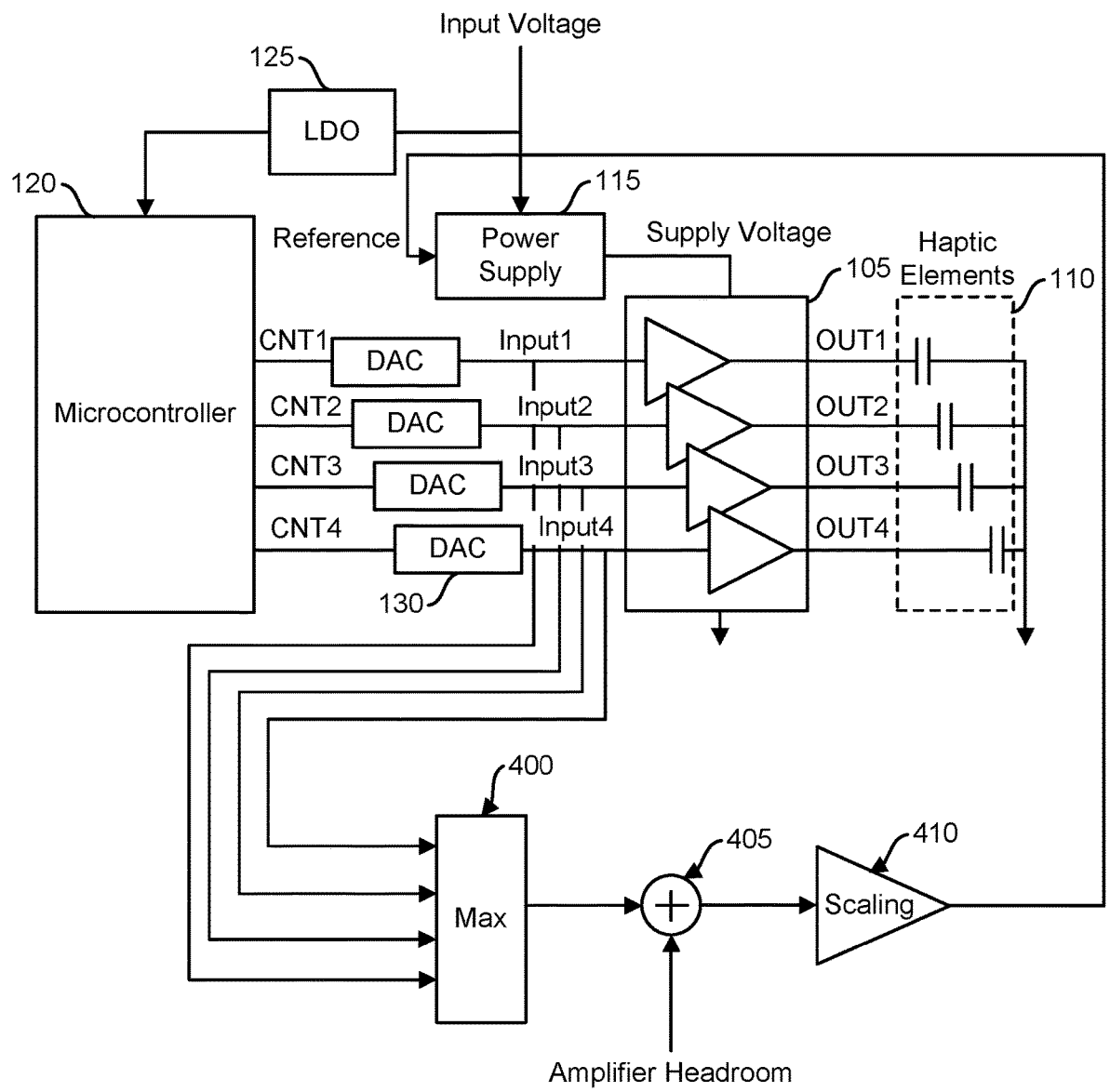
FIG. 6A shows a circuit diagram of a haptic application having a circuit for generating a reference voltage provided to a power supply that modulates a power supply voltage to track the analog input voltage provided to multiple amplifiers according to various examples of the present disclosure.

FIG. 6A shows a circuit diagram of a haptic application having the circuit shown in FIG. 4A for generating a reference voltage provided to a power supply that modulates a power supply voltage to track the analog input voltage provided to multiple amplifiers according to various examples of the present disclosure. As discussed in connection with FIG. 4A, the analog input voltages Input1 to Input 4 provided to the amplifier array 105 may be received as inputs by the peak detection circuit 400, which detects the instantaneous analog input voltage for each of the received analog input voltages and outputs information regarding the maximum instantaneous analog input voltage of the received amplifier analog input voltages. According to various examples of the present disclosure, the information may be the maximum instantaneous analog input voltage. The maximum instantaneous input voltage is input to a summing circuit 405 that outputs the sum of the received information regarding the maximum instantaneous input voltage and an amplifier headroom voltage. The amplifier headroom voltage may vary depending on the application but may be determined to avoid saturating any of the amplifiers of the amplifier array 105. The output of the summing circuit 405 may be input into a scaling circuit 410 that is configured to scale the sum of the received information regarding the maximum instantaneous input voltage and the amplifier headroom voltage output from the summing circuit 405 to be greater, or lesser, depending on the application, to generate a reference voltage for the power supply. The generated reference voltage of the scaling circuit 410 is provided as a reference voltage to the power supply 115, which modulates a supply voltage based on the received reference voltage, and provides the supply voltage to the amplifier array 105. There is no requirement that the output of the summing circuit 405, or of the scaling circuit 410, be used directly as the reference voltage, and the reference voltage may be generated responsive to the output of the summing circuit 405, or of the scaling circuit 410, without exceeding the scope.

Figure 6B:
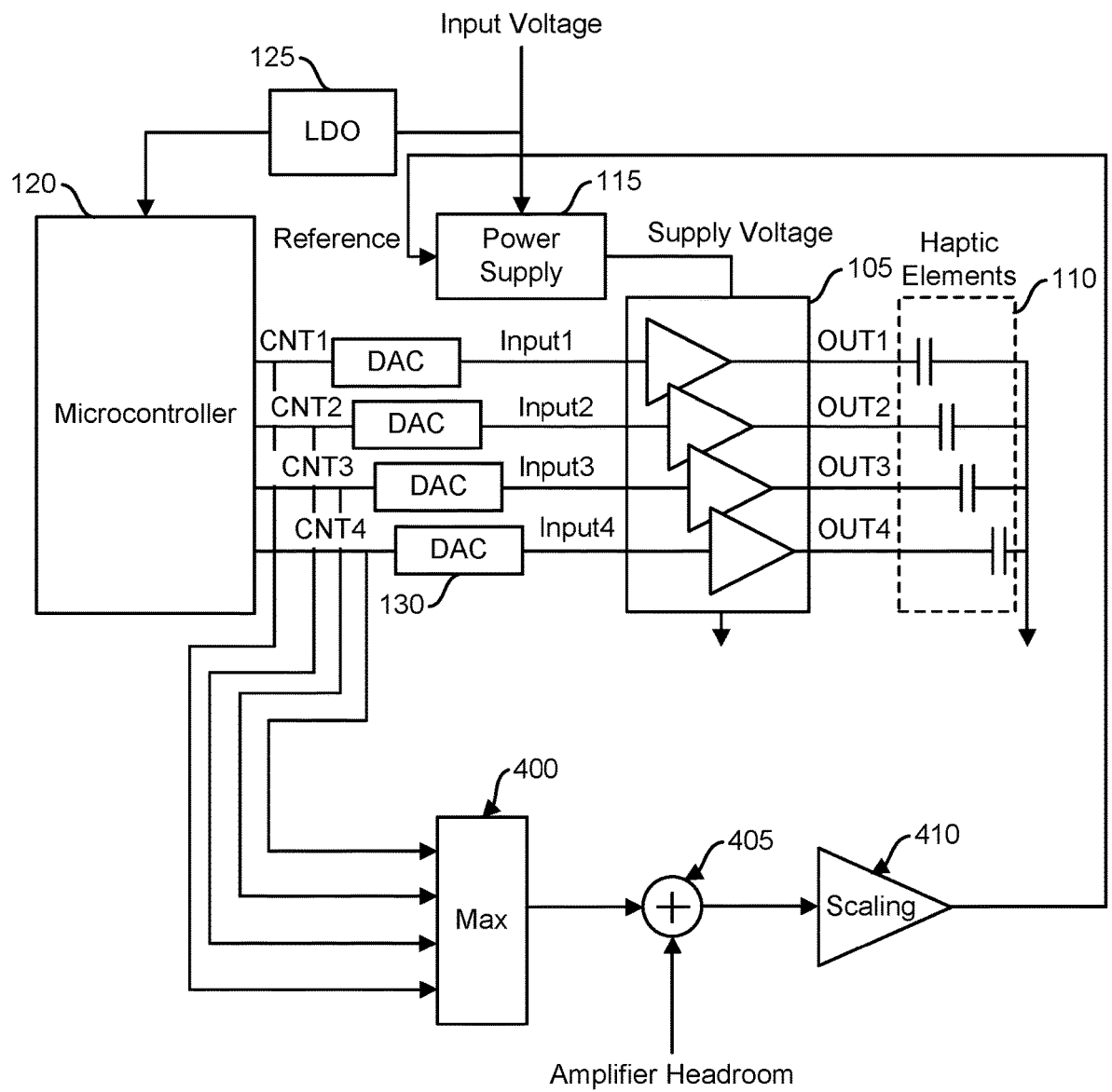
FIG. 6B shows a circuit diagram of a haptic application having a circuit for generating a reference voltage provided to a power supply that modulates a power supply voltage to track the digital control signals that are converted and ultimately provided as input voltages to multiple amplifiers according to various examples of the present disclosure.

FIG. 6B shows a circuit diagram of a haptic application having the circuit shown in FIG. 4B for generating a reference voltage provided to a power supply that modulates a power supply voltage to track the digital control signals that are converted, and ultimately provided as input voltages to multiple amplifiers according to various examples of the present disclosure. In contrast to FIG. 6A, the peak detection circuit 400 receives digital control signals CNT1 to CNT4 from the microcontroller 120, identifies a maximum digital control signal from the received digital control signals, and outputs information regarding the identified maximum digital control signal. In various examples, the information may be the digital control signal having the maximum value. The maximum digital control signal may be increased by a digital representation of the amplifier headroom voltage using summing circuit 405, and then optionally scaled by scaling circuit 410. The digital, optionally-scaled voltage may then be provided as the reference voltage to the power supply 115. In one example, the digital, optionally-scaled voltage, may be converted by a D/A converter for provision as the reference voltage to the power supply 115.

Figure 6C:
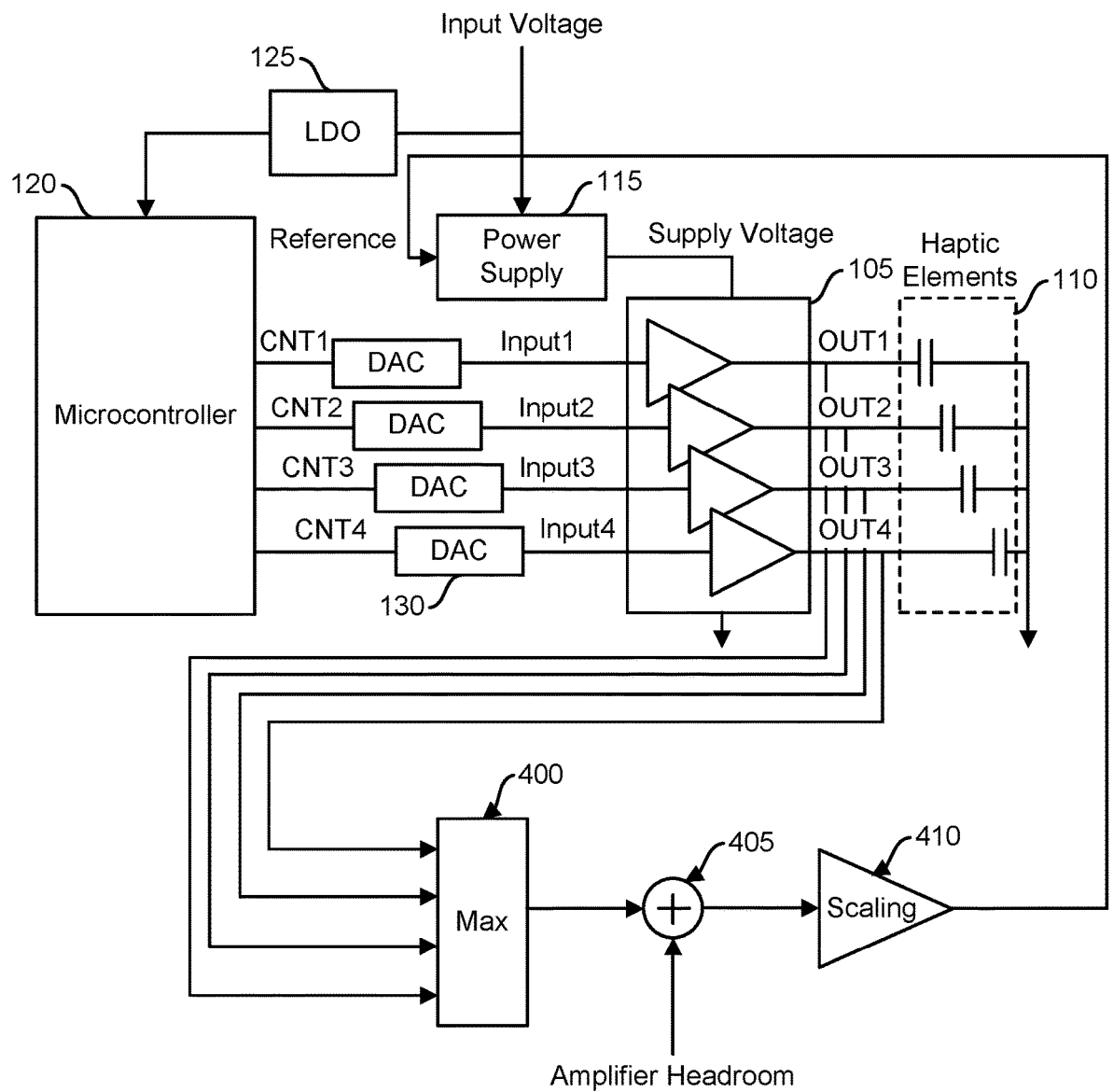
FIG. 6C shows a circuit diagram of a haptic application having a circuit for generating a reference voltage provided to a power supply that modulates a power supply voltage to track the analog output voltages output by multiple amplifiers according to various examples of the present disclosure.

FIG. 6C shows a circuit diagram of a haptic application having the circuit shown in FIG. 4C for controlling a reference voltage provided to a power supply that generates a power supply voltage to track the analog output voltages output by multiple amplifiers according to various examples of the present disclosure. In contrast to FIGS. 6A and 6B, the peak detection circuit 400 receives a representation of output voltages OUT1 to OUT4 from the plurality of amplifiers 105, and outputs information regarding the maximum instantaneous output voltage of the received amplifier output voltages. According to various examples of the present disclosure, the information is the maximum instantaneous output voltage. The maximum instantaneous output voltage may be input to the summing circuit 405, which outputs the sum of received information regarding the maximum instantaneous output voltage and the amplifier headroom voltage. The output of the summing circuit 405 may be input into a scaling circuit 410 that is configured to scale the voltage output from the summing circuit 405 to be greater or lesser depending on the application. The output voltage of the scaling circuit 410 is provided as a reference voltage to the power supply 115, which provides a power supply voltage to the amplifier array 105, which power supply voltage is controlled responsive to the provided reference voltage. There is no requirement that the output of the summing circuit 405, or of the scaling circuit 410, be used directly as the reference voltage, and the reference voltage may be generated responsive to the output of the summing circuit 405, or of the scaling circuit 410, without exceeding the scope.

The circuit shown in FIGS. 4B, 6B, may be implemented via software, for example, using an existing microcontroller that may already be used for other purposes. For example, a microcontroller that may be used for control in haptic applications could be used to implement software configured to modulate the power supply voltage 500 as described above with respect to FIG. 4B, 6B. By using pre-existing components to implement software that modulates the power supply voltage based on the maximum instantaneous analog input voltage, a reduction in power dissipation can be achieved without requiring any additional hardware. Alternatively, the circuit of FIGS. 4A-4C may be implemented using hardware components, such as a Field Programmable Gate Array (FPGA) or an Application Specific Integrated Circuit (ASIC), which performs certain tasks. Although the various examples discussed above have been described in the context of haptic applications, the various examples are not limited to such applications and can apply to many other applications such as consumer, industrial, and automotive applications.

Many different examples have been disclosed herein, in connection with the above description and the drawings. It will be understood that it would be unduly repetitious to literally describe and illustrate every combination and subcombination of these examples. Accordingly, all examples can be combined in any way and/or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A circuit for modulating a power supply voltage provided to a plurality of amplifiers, the circuit comprising:
   a peak detection circuit to receive respective analog input voltages provided to the plurality of amplifiers, and to detect and output information regarding a maximum instantaneous analog input voltage from the received respective analog input voltages; and
   a summing circuit to output a sum of the information regarding the maximum instantaneous analog input voltage output from the peak detection circuit and an amplifier headroom voltage,
   wherein a reference voltage is provided to the power supply voltage responsive to the output sum.

2. The circuit of claim 1, comprising a scaling circuit to scale the output sum, wherein the reference voltage provided for the power supply voltage is responsive to an output of the scaling circuit.

3. The circuit of claim 1, wherein the information regarding the maximum instantaneous analog input voltage is the maximum instantaneous analog input voltage.

4. The circuit of claim 1, wherein the amplifier headroom voltage is a predetermined voltage configured to avoid saturating the plurality of amplifiers.

5. A circuit for modulating a power supply voltage provided to a plurality of amplifiers, the circuit comprising:
   a peak detection circuit to receive a plurality of respective digital control signals provided for the plurality of amplifiers, and to detect and output information regarding a maximum digital control signal from the plurality of respective digital control signals; and
   a summing circuit to output a sum of the information regarding the maximum digital control signal output from the peak detection circuit and an amplifier headroom voltage,
   wherein a reference voltage is provided to the power supply voltage responsive to the output sum.

6. The circuit of claim 5, comprising a scaling circuit to scale the output sum, wherein the reference voltage is responsive to an output of the scaling circuit.

7. The circuit of claim 5, wherein the information regarding the maximum digital control signal is the maximum digital control signal.

8. The circuit of claim 5, wherein the amplifier headroom voltage is a predetermined voltage to avoid saturating the plurality of amplifiers.

9. A circuit for modulating a power supply voltage provided to a plurality of amplifiers, the circuit comprising:
   a peak detection circuit to receive a plurality of respective output voltages output by the plurality of amplifiers, and to detect and output information regarding a maximum instantaneous output voltage from the received respective output voltages;
   a summing circuit to output a sum of the information regarding the maximum instantaneous output voltage output from the peak detection circuit and an amplifier headroom voltage; and
   a scaling circuit configured to scale the output sum,
   wherein a reference voltage is provided to the power supply voltage responsive to the output sum; and
   wherein the provided reference voltage is responsive to an output of the scaling circuit.

10. The circuit of claim 9, wherein the information regarding the maximum instantaneous output voltage is the maximum instantaneous output voltage.

11. The circuit of claim 9, wherein the amplifier headroom voltage is a predetermined voltage to avoid saturating the plurality of amplifiers.

12. A circuit for modulating a power supply voltage provided to a plurality of amplifiers, the circuit comprising:
   a peak detection circuit to receive a plurality of voltages respectively corresponding to the plurality of amplifiers, and to detect and output information regarding a maximum instantaneous voltage from the received plurality of voltages;
   a summing circuit to output a sum of the information regarding the maximum instantaneous voltage output from the peak detection circuit and an amplifier headroom voltage; and
   a scaling circuit to scale the output sum,
   wherein a reference voltage is provided to the supply voltage responsive to the output sum; and
   wherein the reference voltage provided for the power supply voltage is responsive to an output of the scaling circuit.

13. The circuit of claim 12, wherein the plurality of voltages received by the peak detection circuit comprises a plurality of respective analog input voltages provided to the plurality of amplifiers.

14. The circuit of claim 12, wherein the plurality of voltages received by the peak detection circuit comprises a plurality of respective digital control signals provided for the plurality of amplifiers.

15. The circuit of claim 12, wherein the plurality of voltages received by the peak detection circuit comprises a plurality of respective output voltages output by the plurality of amplifiers.

16. The circuit of claim 12, wherein the information regarding the maximum instantaneous voltage is the maximum instantaneous voltage.

17. The circuit of claim 12, wherein the amplifier headroom voltage is a predetermined voltage to avoid saturating the plurality of amplifiers.

18. A method of modulating a power supply voltage provided to a plurality of amplifiers, the method comprising:
   receiving a plurality of voltages respectively corresponding to the plurality of amplifiers;
   detecting a maximum instantaneous voltage from the received plurality of voltages, and outputting information regarding the maximum instantaneous voltage;
   generating a reference voltage by summing the information regarding the maximum instantaneous voltage and an amplifier headroom voltage; and
   providing the reference voltage to a power supply, the power supply providing the power supply voltage to the plurality of amplifiers responsive to the provided reference voltage.

19. The method of claim 18, comprising:
   scaling the reference voltage to generate a scaled reference voltage; and
   providing the scaled reference voltage to the power supply as the reference voltage.

20. The method of claim 18, wherein the information regarding the maximum instantaneous voltage is the maximum instantaneous voltage.

21. The method of claim 18, wherein the amplifier headroom voltage is a predetermined voltage to avoid saturating the plurality of amplifiers.

* * * * *